United States Patent
Nam et al.

(10) Patent No.: US 8,581,092 B2
(45) Date of Patent: Nov. 12, 2013

(54) TANDEM SOLAR CELL AND METHOD OF MANUFACTURING SAME

(75) Inventors: Jung-Gyu Nam, Suwon-si (KR); Jin-Soo Mun, Geoje-si (KR); Sang-Cheol Park, Seoul (KR)

(73) Assignees: Samsung SDI Co., Ltd., Yongin-si (KR); Samsung Display Co., Ltd., Yongin-si (KR)

( * ) Notice: Subject to any disclaimer, the term of this patent is extended or adjusted under 35 U.S.C. 154(b) by 321 days.

(21) Appl. No.: 12/756,352

(22) Filed: Apr. 8, 2010

(65) Prior Publication Data

US 2011/0005578 A1    Jan. 13, 2011

(30) Foreign Application Priority Data

Jul. 10, 2009  (KR) .................. 10-2009-0063001

(51) Int. Cl.
  *H01L 31/00* (2006.01)
  *H01L 21/00* (2006.01)
(52) U.S. Cl.
  USPC ........... 136/255; 136/252; 136/262; 136/264; 136/265; 438/57; 438/95
(58) Field of Classification Search
  USPC .............. 136/252, 255, 258, 262, 264, 265; 438/57, 95
  See application file for complete search history.

(56) References Cited

U.S. PATENT DOCUMENTS

| 5,009,719 A | 4/1991 | Yoshida |
| 5,981,868 A * | 11/1999 | Kushiya et al. ............ 136/262 |
| 6,121,541 A * | 9/2000 | Arya ............................. 136/255 |
| 2005/0056312 A1* | 3/2005 | Young et al. ................. 136/258 |

FOREIGN PATENT DOCUMENTS

| JP | 08-125207 | 5/1996 |
| JP | 09-213977 | 8/1997 |
| JP | 10-135495 | 5/1998 |
| JP | 2007-335792 | 12/2007 |

* cited by examiner

*Primary Examiner* — Jonathan Johnson
*Assistant Examiner* — Lidsey Bernier
(74) *Attorney, Agent, or Firm* — Christie, Parker & Hale, LLP

(57) ABSTRACT

A tandem solar cell includes: a substrate; a front electrode disposed on the substrate; a back electrode disposed opposite to the front electrode on the substrate; a first cell disposed below the front electrode and including a first buffer layer and a first light absorption layer; and a second cell disposed above the back electrode and including a second light absorption layer and a second buffer layer. The first light absorption layer includes a CuGaSeS layer and a CuGaSe layer, and the second light absorption layer includes a semiconductor compound selected from the group consisting of $CuInSe_2$, $CuInGaSe_2$, CuInSeS, CuInGaSeS and any combinations thereof. The CuGaSeS layer of the first light absorption layer is disposed closer than the CuGaSe layer of the first light absorption layer to the front electrode.

20 Claims, 2 Drawing Sheets

TANDEM SOLAR CELL AND METHOD OF MANUFACTURING SAME

This application claims priority to Korean Patent Application No. 10-2009-0063001, filed on Jul. 10, 2009, and all the benefits accruing therefrom under 35 U.S.C. §119, the content of which in its entirety is herein incorporated by reference.

BACKGROUND OF THE INVENTION

1. Field of the Invention

The general inventive concept relates to a tandem solar cell and a method of manufacturing the same and, more particularly, to a tandem solar cell with substantially improved light transmission and solar light utility efficiency, and a method of manufacturing the tandem solar cell.

2. Description of the Related Art

A solar cell transforms solar energy into electrical energy. The solar cell typically includes a diode formed by a p-n junction, e.g., by joining p-type and n-type semiconductors.

In general, solar cells can be classified into different types based on a material, such as silicon, used in a light absorption layer of the solar cell. Additionally, a solar cell using silicon in a light absorption layer thereof may be further classified into a crystalline wafer-type solar cell and an amorphous or polycrystalline thin film-type solar cell.

Other types of solar cells include compound thin film solar cells using copper indium gallium diselenide ($CuInGaSe_2$ or "CIGS") or cadmium telluride (CdTe), solar cells using group-III or group-IV materials, dye-sensitive solar cells and organic solar cells, for example.

BRIEF SUMMARY OF THE INVENTION

One or more exemplary embodiments provide a tandem solar cell substantially improved light transmission and solar light utility efficiency.

According to an exemplary embodiment, a solar cell includes: a substrate; front electrode disposed on the substrate; a back electrode disposed opposite to the front electrode on the substrate; a first cell disposed below the front electrode and including a first buffer layer and a first light absorption layer; and a second cell disposed above the back electrode and including a second light absorption layer and a second buffer layer. The first light absorption layer includes a CuGaSeS layer and a CuGaSe layer, and the second light absorption layer includes a semiconductor compound selected from the group consisting of $CuInSe_2$, $CuInGaSe_2$, CuInSeS, CuInGaSeS and any combinations thereof. The CuGaSeS layer of the first light absorption layer is disposed closer than the CuGaSe layer of the first light absorption layer to the front electrode.

According to another exemplary embodiment, a method of manufacturing a tandem cell is provided, and the method includes: disposing a back electrode on a substrate, forming a second cell by disposing a second light absorption layer and a second buffer layer on the substrate, forming a second cell by disposing a first light absorption layer and a first buffer layer on the substrate, and disposing a front electrode on the substrate. The first light absorption layer includes a CuGaSeS layer and a CuGaSe layer, and the second light absorption layer includes a semiconductor compound selected from the group consisting of $CuInSe_2$, $CuInGaSe_2$, CuInSeS, CuInGaSeS and any combinations thereof.

The CuGaSeS layer may include sulfur, and a content of the sulfur is not more than about 0.3 parts by weight when a content of selenium in the CuGaSeS layer is about 100 parts by weight.

A concentration gradient of the sulfur in the CuGaSeS layer decreases along a direction from the front electrode toward the CuGaSe layer.

A concentration of sulfur on a first surface of the CuGaSeS layer, the first surface being closer to the front electrode than the CuGaSe layer, and a concentration of sulfur on a second surface of the CuGaSeS layer, the second surface being closer to the CuGaSe layer than the front electrode, have a concentration gradient of about 1 atomic percent to about 0.01 atomic percent through about 1 atomic percent to about 0.3 atomic percent.

A ratio of a thickness of the CuGaSeS layer to a thickness of the CuGaSe layer is from about 1:10 to about 1:2.

A bandgap energy of the CuGaSeS layer is from about 1.6 electron volts to about 1.9 electron volts.

A bandgap energy of the CuGaS layer is from about 1.5 electron volts to about 1.8 electron volts.

A bandgap energy of the second light absorption layer is from about 1.0 electron volt to about 1.4 electron volts.

A bandgap energy difference between the first light absorption layer and the second light absorption layer is from about 0.1 electron volts to about 1.0 electron volt.

A bandgap energy difference between the first light absorption layer and the second light absorption layer is from about 0.3 electron volts to about 0.7 electron volts.

The first cell and the second cell may be connected by a tunnel diode.

The substrate may be disposed above the front electrode.

BRIEF DESCRIPTION OF THE DRAWINGS

The above and other aspects and features of the general inventive concept will become more readily apparent by describing in further detail exemplary embodiments thereof with reference to the accompanying drawings, in which.

DETAILED DESCRIPTION OF THE INVENTION

Figure 1:
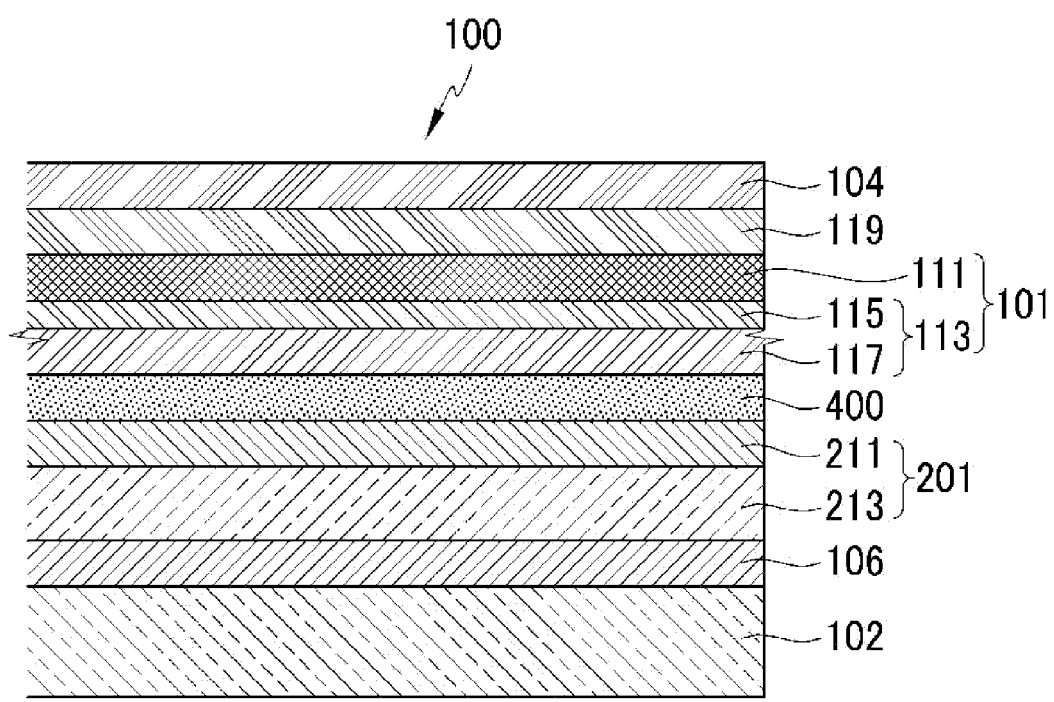
FIG. 1 is a partial cross-sectional view of a tandem solar cell according to one exemplary embodiment.

The general inventive concept now will be described more fully hereinafter with reference to the accompanying drawings, in which various exemplary embodiments are shown. This invention may, however, be embodied in many different forms, and should not be construed as limited to the embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

A tandem solar cell according to an exemplary embodiment will now be described in greater detail with reference to FIG. 1, which is a partial cross-sectional view of the tandem solar cell according to an exemplary embodiment.

As shown in FIG. 1, a tandem solar cell 100, which in one or more exemplary embodiments is a substrate-type tandem solar cell 100, includes a back electrode 106, a second cell 201, a first cell 101 and a front electrode 104 disposed on a substrate 102.

The tandem solar cell 100 includes the front electrode 104 and the back electrode 106 disposed opposite to the front electrode 104 on the substrate 102, and further includes the first cell 101, which in one or more exemplary embodiments is an upper cell 101, and the second cell 201, which in one or more exemplary embodiments is a lower cell 201, disposed between the front electrode 104 and the back electrode 106. The first cell 101 includes a first buffer layer 111 and a first light absorption layer 113 disposed under, e.g., below, the front electrode 104 (as viewed in FIG. 1), and the second cell 201 includes a second light absorption layer 213 and a second buffer layer 211 disposed over, e.g., above, the back electrode 106 (as viewed in FIG. 1). The first light absorption layer 113 includes a copper gallium selenide sulfur (CuGaSeS or "CGSS") layer 115 and a copper gallium selenide (CuGaSe) layer 117, and the second light absorption layer 213 includes a semiconductor compound selected from the group consisting of copper indium diselenide ($CuInSe_2$), copper indium gallium diselenide ($CuInGaSe_2$), copper indium selenide sulfur (CuInSeS), copper indium gallium selenide sulfur (CuInGaSeS), and a combination (or combinations) thereof. In one or more exemplary embodiments, the CuGaSeS layer 115 of the first light absorption layer 113 is disposed closer to the front electrode 104 than the CuGaSe layer 117, as shown in FIG. 1.

The substrate 102 may include a hard material or, alternatively, may be formed of a flexible material. Non-limiting examples of the hard material for the substrate 102 include a glass plate, a quartz plate, a silicon plate, a synthetic resin plate and a metal plate, but alternative exemplary embodiments are not limited thereto. Examples of the synthetic resin include polyethylene naphthalate ("PEN"), polyethylene terephthalate ("PET"), polycarbonate, polyvinyl alcohol, polyacrylate, polyimide, polynorbornene and polyethersulfone ("PES"), but alternative exemplary embodiments are not limited thereto. In one or more exemplary embodiments, the metal plate includes a stainless steel foil or an aluminum foil, for example.

Still referring to FIG. 1, the front electrode 104 includes a transparent conductive material that is conductive and transmits solar light incident thereon. Specifically, for example, the transparent conductive material may include a transparent conductive oxide ("TCO"), such as aluminum doped zinc oxide ("ZnO:Al"), boron doped zinc oxide ("ZnO:B"), fluorine-doped tin dioxide ("$SnO_2$:F"), and/or indium tin oxide ("ITO"), which minimizes a decrease in optical transmission, has low specific resistance and fine surface roughness.

The back electrode 106 may include molybdenum (Mo), aluminum (Al), silver (Ag), gold (Au), platinum (Pt), nickel (Ni) and/or copper (Cu), for example.

The first cell 101, disposed under the front electrode 104, includes the first buffer layer 111 and the first light absorption layer 113. The second cell 201, disposed on the back electrode 106, includes the second light absorption layer 213 and the second buffer layer 211.

The first buffer layer 111 and the second buffer layer 211 may use an n-type semiconductor to reduce a lattice constant difference and bandgap difference between the first light absorption layer 113 and the front electrode 104. Non-limiting examples of the n-type semiconductor include cadmium sulfide (CdS), zinc sulfide (ZnS), zinc sulfate ($ZnS_xO_{1-x}$, where $0<x<1$), zinc sulfate hydroxide ($ZnS_xO_yOH_{1-x-y}$, where $0<x+y<1$), indium sulfide ($In_2S_3$), indium sulfate ($InS_xO_{1-x}$, where $0<x<1$), indium sulfate hydroxide ($InS_xO_yOH_{1-x-y}$, where $0<x+y<1$), but alternative exemplary embodiments are not limited thereto.

As shown in FIG. 1, the first light absorption layer 113 includes a CuGaSeS layer 115 and a CuGaSe layer 117. In one or more exemplary embodiments, the CuGaSeS layer 115 is disposed closer to the front electrode 104 than the CuGaSe layer 117.

The CuGaSeS layer 115 may include sulfur having a content of less than about 0.3 parts by weight when the selenium in the CuGaSeS layer 115 is about 100 parts by weight. In one or more exemplary embodiments, the CuGaSeS layer 115 may include sulfur in a content from about 0.01 parts by weight to about 0.3 parts by weight. Thus, a bandgap of the first light absorption layer 113 increases, and when junctioned with an n-type semiconductor, an open circuit voltage ("Voc") of the solar cell increases. Therefore, an optical efficiency of the solar cell according to an exemplary embodiment is substantially improved.

The CuGaSeS layer 115 may have a concentration gradient of sulfur that decreases it goes from a first surface of the CuGaSeS layer 115, closer to the front electrode 104, to a second surface of the CuGaSeS layer 115, closer to the CuGaSe layer 117, e.g., decreases along a direction from the front electrode 104 toward the CuGaSe layer 117. In one or more exemplary embodiments, the sulfur concentration on the first surface and the sulfur concentration on the second sulfur may have a concentration gradient from about 1 atom % to about 0.01 atom % through 1 atom % to about 0.3 atom %. Thus, the solar cell 100 according to an exemplary embodiment provides a light absorption layer having a bandgap that is appropriate for a diverse number of solar light wavelengths.

A thickness of the CuGaSeS layer 115 may be formed to have a thickness ratio from about 1:10 to about 1:2 with respect to a thickness of the CuGaSe layer 117. Accordingly, an optical efficiency is substantially improved.

The CuGaSeS layer 115 according to one or more exemplary embodiments may have a bandgap energy from about 1.6 electron volts (eV) to about 1.9 eV. The CuGaSe layer 117 may have a bandgap energy from about 1.5 eV to about 1.8 eV or, alternatively, from about 1.6 eV to about 1.7 eV. As a result, a bandgap difference between the first light absorption layer 113 and the second light absorption layer 213 is easily controlled.

In one or more exemplary embodiments, the second light absorption layer 213 may include a semiconductor compound selected from the group consisting of $CuInSe_2$, $CuInGaSe_2$, CuInSeS, CuInGaSeS, and a combination (or combinations) thereof, and the second light absorption layer 213 may have a bandgap energy from about 1.0 eV to about 1.4 eV. Therefore, a bandgap difference between the first light absorption layer 113 and the second light absorption layer 213 is easily controlled.

Specifically, the first light absorption layer 113 and the second light absorption layer 213 may have a bandgap energy difference therebetween from about 0.1 eV to about 1.0 eV, or, in another exemplary embodiment, they may have a bandgap energy difference from about 0.3 eV to about 0.7 eV.

In the solar cell 100 according to one or more exemplary embodiments, the first cell 101, including the first light absorption layer 113 having a wide bandgap, is disposed on a surface (e.g., a side) of the solar cell 100 where incident light enters, to absorb light having a relatively short wavelength (and subsequently, a relatively high energy) and a short transmission length, and the second cell 201, including the second light absorption layer 213 having a relatively narrow bandgap, is disposed under the first cell 101 to absorb light of a relatively long wavelength (and thereby having relatively low energy). As a result, the light with the short wavelength (having high energy) is effectively prevented from being lost and, accordingly, a utility efficiency of solar light is substantially improved.

Additionally, optical transmission and voltage characteristics of the solar cell 100 are substantially improved, since the CuGaSeS layer 115 is disposed on the side where incident light enters in the first light absorption layer 113.

In another exemplary embodiment, an anti-reflection layer 119 may be disposed between the front electrode 104 and the first buffer layer 111. The anti-reflection layer may be formed of one selected from the group consisting of silicon nitride ($Si_3N_4$), titanium dioxide ($TiO_2$), magnesium fluoride ($MgF_2$), and a combination (or combinations) thereof.

The first cell 101 and the second cell 201 may be connected via a tunnel diode 400. Specifically, for example, a $P^{++}$ layer may be disposed under the first cell 101 and an $n^{++}$ layer may be disposed over the second cell 201, and the two cells 101 and 201 may thereby be connected to each other through a tunnel junction, e.g., the tunnel diode 400 formed therebetween.

Figure 2:
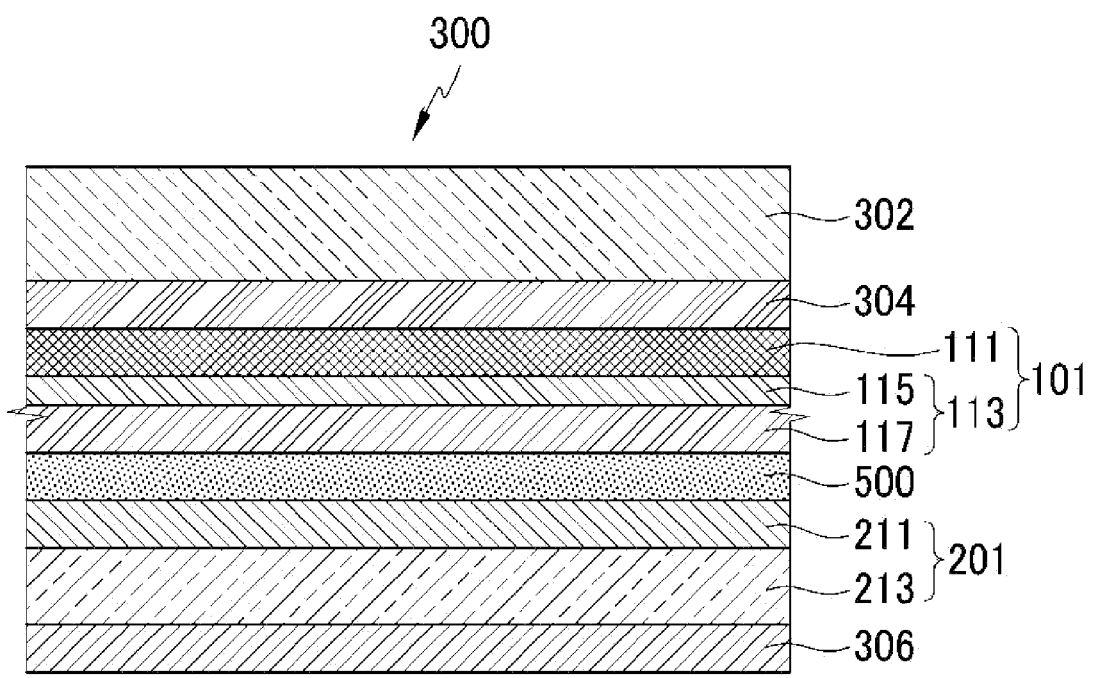
FIG. 2 is a partial cross-sectional view of a tandem solar cell according to another exemplary embodiment.

FIG. 2, which is a partial cross-sectional view of a tandem solar cell according to one or more additional exemplary embodiments, illustrates a tandem solar cell 300, e.g., a "superstrate" type tandem solar cell 300, which includes a front electrode 304, a first cell 101, a second cell 201 and a back electrode 306 disposed on a substrate 302. In the "superstrate" tandem solar cell 300, the substrate 302 is transparent substrate 302, and light enters through the transparent substrate 302. The front electrode 304 and the back electrode 306 are formed of substantially the same materials as the front electrode 104 and the back electrode 106, respectively, described in greater detail above with reference to FIG. 1, and any repetitive detailed description thereof will hereinafter be omitted.

Referring again to FIG. 1, an exemplary embodiment of a method of manufacturing the tandem solar cell 100 will now be described in further detail. As shown in FIG. 1, the back electrode 106, formed of a metal thin film, is disposed on, e.g., is provided on, the substrate 102 using a sputtering or an evaporation method, for example. The second light absorption layer 213 and the second buffer layer 211 are sequentially disposed over, e.g., above, the back electrode 106 to form the second cell 201. In one or more exemplary embodiments, the second light absorption layer 213 may be formed by simultaneously evaporating copper, indium, selenium, and/or gallium (which constitute the second light absorption layer 213) in an atmosphere of hydrogen sulfide ($H_2S$), or, alternatively, screen printing using nano-particles including the above-listed elements, but alternative exemplary embodiments are not limited thereto. The second buffer layer 211 may be formed using a sputtering method, a sol-gel method, a pyrolysis method or a spray pyrolysis method, for example.

To form the first light absorption layer 113, a CuGaSe layer is formed by simultaneously evaporating copper, gallium and selenium or, alternatively, by screen printing using nano-particles including copper, gallium, and sulfur elements, and the upper part of the CuGaSe layer is sulfurized to thereby form a CuGaSeS layer 115 in the upper part and a CuGaSe layer 117 in the lower part and to form the first light absorption layer 113. A sulfide process may be used to form a CuGaSeS layer, such as by supplying hydrogen sulfide ($H_2S$)

during formation of the CuGaSe layer, or the CuGaSeS layer may be formed by performing heat treatment to the CuGaSe layer in an atmosphere of hydrogen sulfide (H$_2$S), but alternative exemplary embodiments are not limited thereto. A thickness of the CuGaSeS layer 115 and a concentration gradient of sulfur are controlled by adjusting an amount of hydrogen sulfide (H$_2$S) supplied during the sulfide process.

The first buffer layer 111 is formed on the first light absorption layer 113 (in substantially the same manner as the second buffer layer 211) to form the first cell 101, and the front electrode 104 is formed to complete the fabrication of the tandem solar cell 100 according to an exemplary embodiment.

Referring now to FIG. 2, an exemplary embodiment of a method of manufacturing the "superstrate" tandem solar cell 300 is substantially the same as discussed above, except for a stacking sequence in forming the first cell 101 and the second cell 201 between the front electrode 304 and the back electrode 306, as shown in FIG. 2.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A tandem solar cell comprising:
   a substrate;
   a front electrode disposed on the substrate;
   a back electrode disposed opposite to the front electrode on the substrate;
   a first cell disposed below the front electrode and including a first buffer layer and a first light absorption layer; and
   a second cell disposed above the back electrode and including a second light absorption layer and a second buffer layer, wherein
   the first light absorption layer consists of a CuGaSeS layer and a CuGaSe layer,
   the second light absorption layer includes a semiconductor compound selected from the group consisting of CuInSe$_2$, CuInGaSe$_2$, CuInSeS, CuInGaSeS and a combination thereof, and
   the CuGaSeS layer of the first light absorption layer is disposed closer than the CuGaSe layer of the first light absorption layer to the front electrode.

2. The tandem solar cell of claim 1, wherein
   the CuGaSeS layer includes sulfur, and
   a content of the sulfur is not more than about 0.3 parts by weight when a content of selenium in the CuGaSeS layer is about 100 parts by weight.

3. The tandem solar cell of claim 1, wherein a concentration gradient of the sulfur in the CuGaSeS layer decreases along a direction from the front electrode toward the CuGaSe layer.

4. The tandem solar cell of claim 3, wherein a concentration of sulfur on a first surface of the CuGaSeS layer, the first surface being closer to the front electrode than the CuGaSe layer, and a concentration of sulfur on a second surface of the CuGaSeS layer, the second surface being closer to the CuGaSe layer than the front electrode, have a concentration gradient of about 1 atomic percent to about 0.01 atomic percent through about 1 atomic percent to about 0.3 atomic percent.

5. The tandem solar cell of claim 1, wherein a ratio of a thickness of the CuGaSeS layer to a thickness of the CuGaSe layer is from about 1:10 to about 1:2.

6. The tandem solar cell of claim 1, wherein a bandgap energy of the CuGaSeS layer is from about 1.6 electron volts to about 1.9 electron volts.

7. The tandem solar cell of claim 1, wherein a bandgap energy of the CuGaSe layer is from about 1.5 electron volts to about 1.8 electron volts.

8. The tandem solar cell of claim 1, wherein a bandgap energy of the second light absorption layer is from about 1.0 electron volt to about 1.4 electron volts.

9. The tandem solar cell of claim 1, wherein a bandgap energy difference between the first light absorption layer and the second light absorption layer is from about 0.1 electron volts to about 1.0 electron volt.

10. The tandem solar cell of claim 1, wherein a bandgap energy difference between the first light absorption layer and the second light absorption layer is from about 0.3 electron volts to about 0.7 electron volts.

11. The tandem solar cell of claim 1, wherein the first cell and the second cell are connected by a tunnel diode.

12. A method of manufacturing a tandem cell, comprising:
    disposing a back electrode on a substrate;
    forming a first cell by disposing a first light absorption layer and a first buffer layer on the substrate;
    forming a second cell by disposing a second light absorption layer and a second buffer layer on the substrate; and
    disposing a front electrode on the substrate, wherein
    the first light absorption layer consists of a CuGaSeS layer and a CuGaSe layer,
    the second light absorption layer includes a semiconductor compound selected from the group consisting of CuInSe$_2$, CuInGaSe$_2$, CuInSeS, CuInGaSeS and any combinations thereof, and
    the CuGaSeS layer is disposed closer than the CuGaSe layer to the front electrode.

13. The method of claim 12, wherein
    the CuGaSeS layer includes sulfur, and
    a content of the sulfur is not more than about 0.3 parts by weight when a content of selenium in the CuGaSeS layer is about 100 parts by weight.

14. The method of claim 12, wherein a concentration gradient of the sulfur in the CuGaSeS layer decreases along a direction from the front electrode toward the CuGaSe layer.

15. The method of claim 14, wherein a concentration of sulfur on a first surface of the CuGaSeS layer, the first surface being closer to the front electrode than the CuGaSe layer, and a concentration of sulfur on a second surface of the CuGaSeS layer, the second surface being closer to the CuGaSe layer than the front electrode, have a concentration gradient of about 1 atomic percent to about 0.01 atomic percent through about 1 atomic percent to about 0.3 atomic percent.

16. The method of claim 12, wherein a ratio of a thickness of the CuGaSeS layer to a thickness of the CuGaSe layer is from about 1:10 to about 1:2.

17. The method of claim 12, wherein a bandgap energy of the second light absorption layer is from about 1.0 electron volt to about 1.4 electron volts.

18. The method of claim 12, wherein a bandgap energy difference between the first light absorption layer and the second light absorption layer is from about 0.1 electron volts to about 1.0 electron volt.

19. The method of claim 12, wherein a bandgap energy difference between the first light absorption layer and the second light absorption layer is from about 0.3 electron volts to about 0.7 electron volts.

20. The method of claim 12, wherein the first cell and the second cell are connected by a tunnel diode.

* * * * *